United States Patent
Elsayed et al.

(10) Patent No.: US 11,303,293 B1
(45) Date of Patent: Apr. 12, 2022

(54) PIXEL RAMP GENERATOR FOR IMAGE SENSOR

(71) Applicant: SHENZHEN GOODIX TECHNOLOGY CO., LTD., Shenzhen (CN)

(72) Inventors: Mohamed Elsayed, San Diego, CA (US); Matthew Powell, San Diego, CA (US); Xiaodong Wang, San Diego, CA (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/187,806

(22) Filed: Feb. 28, 2021

(51) Int. Cl.
*H03M 1/56* (2006.01)
*H04N 5/363* (2011.01)
*H04N 5/3745* (2011.01)
*H03M 1/54* (2006.01)

(52) U.S. Cl.
CPC .............. *H03M 1/56* (2013.01); *H03M 1/54* (2013.01); *H04N 5/363* (2013.01); *H04N 5/37455* (2013.01)

(58) Field of Classification Search
CPC .......... H03M 1/56; H03M 1/54; H04N 5/363; H04N 5/37455
See application file for complete search history.

(56) References Cited

U.S. PATENT DOCUMENTS

2018/0167573 A1\* 6/2018 Zhu ................. H04N 5/378

FOREIGN PATENT DOCUMENTS

WO WO-2021060177 A1 \* 4/2021

\* cited by examiner

*Primary Examiner* — Nicholas G Giles

(74) *Attorney, Agent, or Firm* — Kilpatrick Townsend & Stockton LLP (57) ABSTRACT

Techniques are described for implementing reduced-noise pixel ramp voltage generators for image sensors. The described pixel ramp voltage generators include circuit blocks to address various conventional causes of ramp generator noise. For example, a reference current is generated. Current steering can be used to toggle between a ramp-run mode for generation of a ramp voltage, and a ramp-stop mode for stopping the generation, thereby mitigating changes in low-frequency noise components between pixel conversion cycles, or phases or such cycles. Buffer multiplier techniques can be used to isolate kickback noise of the pixel conversion comparators from components generating the ramp voltage, such as to mitigate image smearing. Some implementations include additional features, such as sample-and-hold techniques used to isolate ramp generation components from current generation component noise, slope calibration techniques to dynamically tune voltage ramp slope, reset techniques, etc.

20 Claims, 5 Drawing Sheets

PIXEL RAMP GENERATOR FOR IMAGE SENSOR

FIELD

The invention relates generally to image sensors. More particularly, embodiments relate to ramp generator circuits for use with pixel conversion in complementary metal-oxide semiconductor (CMOS) image sensors.

BACKGROUND

Many electronic devices include cameras and other features that rely on digital image sensors. For example, most modern smartphones include one or more digital cameras that rely on digital image sensing hardware and software to capture and process images. Such applications often perform image sensing using a complementary metal-oxide semiconductor (CMOS) image sensor (CIS). Over time, consumers have desired increased performance from these image sensors, including higher resolution and lower noise. Further, particularly in portable electronic devices (e.g., with fixed battery capacity), it has been desirable to provide such features without adversely impacting power consumption and dynamic range. For example, analog power drives a significant, if not dominant, part of the power consumption of a modern CIS. As such, implementing a high-performance CIS in a portable electronic device can involve designing analog-to-digital converters (ADCs) and other components within strict power efficiency and noise constraints.

The ADCs in the CMOS image sensors convert analog pixel information into digital code. Conventional architectures typically include a ramp-based ADC that compares an analog pixel output voltage (corresponding to signal intensity detected by the pixel) against a reference ramp voltage. Typically, a same ramp voltage is shared across an entire row of pixels. As modern image sensors can typically include thousands of pixels in each row, there can typically be thousands of comparators being used in the row for analog-to-digital conversion, all based on the same ramp voltage. The comparator and the ramp generator can be significant sources of noise in each row of pixels, and image quality can depend appreciably on keeping that noise well below other pixel noise (e.g., random pixel noise).

BRIEF SUMMARY OF THE INVENTION

Embodiments provide reduced-noise pixel ramp voltage generators for image sensors. The described pixel ramp voltage generators include circuit blocks to address various conventional causes of ramp generator noise. For example, a reference current is generated. Current steering can be used to toggle between a ramp-run mode for generation of a ramp voltage, and a ramp-stop mode for stopping the generation, thereby mitigating changes in low-frequency noise components between pixel conversion cycles, or phases or such cycles. Buffer multiplier techniques can be used to isolate kickback noise of the pixel conversion comparators from components generating the ramp voltage, such as to mitigate image smearing. Some implementations include additional features, such as sample-and-hold techniques used to isolate ramp generation components from current generation component noise, slope calibration techniques to dynamically tune voltage ramp slope, reset techniques, etc.

According to one set of embodiments, a pixel ramp voltage generator is provided. The pixel ramp voltage generator includes: a current generator to generate a reference current; a current steering block coupled with the current generator to selectively toggle between a ramp-run mode and a ramp-off mode based on a ramp start/stop signal, the current steering block being configured, when operating in the ramp-run mode, to steer the reference current to a load path to generate a ramp voltage at a ramp voltage output node, and the current steering block being configured, when operating in the ramp-stop mode, to steer the reference current to a ramp-stop path; and a buffer multiplier block comprising a plurality of buffers, each buffer coupled with the ramp voltage output node and configured to buffer the ramp voltage for provision as a respective buffered-ramp input voltage to each of a respective set of pixel conversion comparators. Some such embodiments are part of an analog-to-digital converter for an image sensor, that includes: the pixel ramp voltage generator above; a controller coupled with the pixel ramp voltage generator to generate a set of control signals including at least the ramp start/stop signal; and the respective sets of pixel conversion comparators coupled with the plurality of buffers of the buffer multiplier block.

According to another set of embodiments, a method is provided for generating a pixel ramp voltage. The method includes: generating a reference current by a current generator; first detecting, at a first time, that a ramp start/stop signal changes state to indicate to toggle a current steering block to a ramp-run mode; generating a ramp voltage by steering the reference current to a load path in response to toggling the current steering block to the ramp-run mode; second detecting, at a second time subsequent to the first time, that a ramp start/stop signal changes state to indicate to toggle a current steering block to a ramp-stop mode; stopping generating the ramp voltage by steering the reference current to a ramp-stop path in response to toggling the current steering block to the ramp-stop mode; and buffering the ramp voltage by each buffer of a plurality of buffers of a buffer multiplier block for provision as a respective buffered-ramp input voltage to each of a respective set of pixel conversion comparators.

According to another set of embodiments, another method is provided for generating a pixel ramp voltage. The method includes: generating a reference current; for each of a plurality of iterations directed by a state controller: in a first timeframe, sampling the reference current from the current generator to generate a sampled reference current, and resetting a ramp voltage; in a second timeframe, subsequent to the first timeframe and triggered by a first change in state of a ramp start/stop signal, holding the sampled reference current, and generating the ramp voltage by steering the sampled reference current to a load path; and in a third timeframe, subsequent to the second timeframe and triggered by a second change in state of the ramp start/stop signal, stopping generating the ramp voltage by steering the reference current to a ramp-stop path, wherein the ramp voltage is buffered by each buffer of a plurality of buffers of a buffer multiplier block and provided, as a respective buffered-ramp input voltage, to each of a respective set of pixel conversion comparators.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
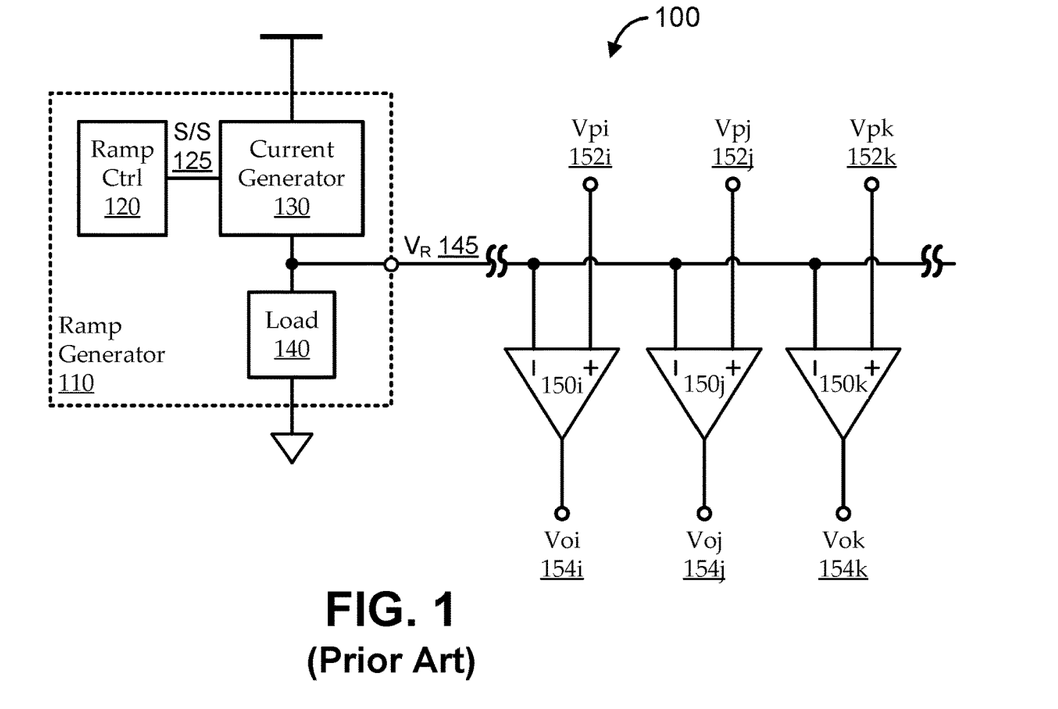
FIG. 1 shows an illustrative conventional pixel analog-to-digital converter.

FIG. 1 shows an illustrative conventional pixel analog-to-digital converter (ADC) 100. As illustrated, the conventional ADC 100 includes a conventional pixel ramp voltage generator 110 coupled with a number of comparators 150. The conventional pixel ramp voltage generator 110 generates a ramp voltage, which can essentially be a voltage that begins at a low starting level and charges to a high ending level in a substantially linear fashion. A simplified block diagram of the conventional pixel ramp voltage generator 110 is illustrated as including a ramp controller 120, a current generator 130, and a load 140. To generate a ramp voltage output ($V_R$) 145, the ramp controller 120 can assert a ramp start signal 125. For example, a start/stop (S/S) signal is used, where ramp start corresponds to one state of the signal (e.g., HIGH), and ramp stop corresponds to the complementary state of the signal (e.g., LOW).

In response to the ramp start signal 125, the current generator 130 begins flowing a charging current through the load 140, which charges the load 140. As one example, the current generator 130 includes transistors, or the like, to inject a substantially constant charging current into a capacitive load 140. Injecting the charging current into the load 140 can cause the voltage across the capacitive load 140 (corresponding to $V_R$ 145) to increase substantially linearly with time. As another example, the current generator 130 includes a programmable current source (e.g., a current digital-to-analog converter controlled by an input code) to inject a changing charging current into a resistive load 140. The input code, or other control of the programmable current source is adjusted over the ramp cycle, such that the changing charging current injected into the load 140 cause the voltage across the resistive load 140 (corresponding to $V_R$ 145) to increase substantially linearly with time.

The output of the conventional pixel ramp voltage generator 110, a same $V_R$ 145, is coupled with a first input (e.g., the negative input) of each of the comparators 150. For example, in this way, the same ramp voltage is shared across all comparators 150 of a row of pixels of an image sensor. The other input (e.g., the positive input) of each of the comparators 150 is coupled with a respective pixel response voltage 152 for a corresponding pixel. For example, the pixel response voltage 152 is an analog output of the pixel corresponding to the intensity of light (e.g., number of photons) detected by the pixel. For the sake of illustration, three comparators 150 are shown, corresponding to three adjacent pixels in a row. The comparators 150 are indicated sequentially as 150$i$, 150$j$, and 150$k$; and the respective pixel response voltages 152 are indicated sequentially as 152$i$, 152$j$, and 152$k$. Each comparator 150 compares its respective pixel response voltage 152 to $V_R$ 145. $V_R$ 145 can be configured so that the ramp begins at a level assumed to be below any pixel response voltage 152, and so that the ramp ends at a level assumed to be above any pixel response voltage 152. At some point in a pixel conversion cycle, the linearly changing level of $V_R$ 145 will cross the level of the pixel response voltage 152, thereby triggering a change in state of the output of the corresponding comparator 150. As different levels of pixel response voltage ($V_P$) 152 will result in different timing for the state change at the output of the comparator 150, the timing can be used as a measure of the pixel output voltage ($V_O$) 154 for that pixel. For example, a digital counter can be used to count an elapsed time from the beginning of the ramp until the transition in state of the pixel output voltage 154, and the final count can be a digital representation of the analog value of the pixel response voltage 152.

Figure 2:
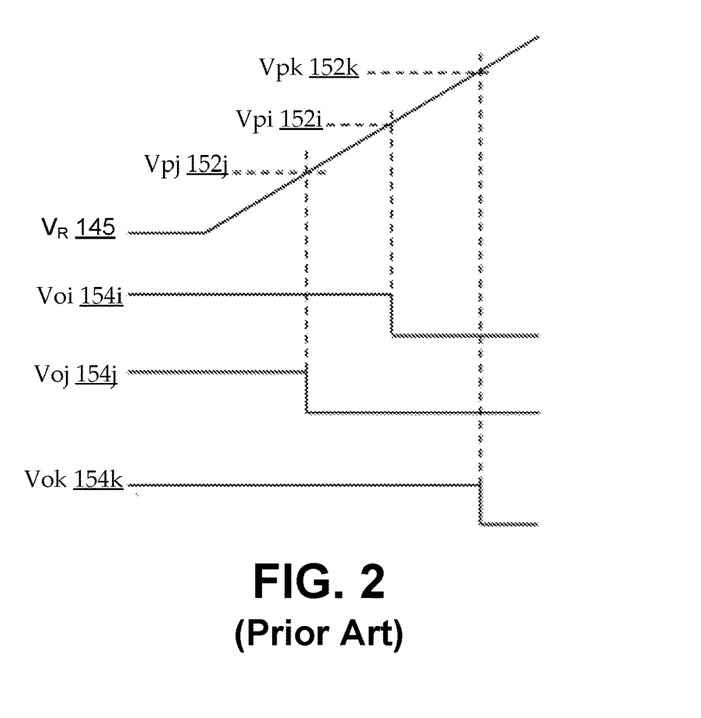
FIG. 2 shows simplified plots of illustrative inputs and outputs of the three comparators of FIG. 1.

For added clarity, FIG. 2 shows simplified plots of illustrative inputs and outputs of the three comparators 150 of FIG. 1. As illustrated, $V_R$ 145 begins at some low level and rises substantially linearly over time. As $V_R$ 145 increases, it crosses the level of $V_P$j 152$j$, of $V_P$i 152$i$, and finally of $V_P$k 152$k$. For example, a photodetector at the pixel corresponding to $V_P$k 152$k$ has the highest detected intensity, followed by the one corresponding to $V_P$i 152$i$, and finally to the one corresponding to $V_P$j 152$j$. Each time the rising level of $V_R$ 145 crosses one of the pixel response voltage 152 levels, the state of the corresponding pixel output voltage 154 (i.e., the output of the corresponding comparator 150) changes from HIGH to LOW. It can be seen, for example, that $V_O$j 154$j$ is HIGH for the shortest time, corresponding to $V_P$j 152$j$ having the lowest detected pixel level.

The process of beginning the ramp, detecting respective timing of ramp level crossings for all the pixels in a row, and ending the ramp can be considered as a pixel row conversion cycle. Many image sensor designs use a two-phase conversion cycle, whereby two conversion phases are used in each cycle for each pixel in each row to generate an ADC result. For example, in a first phase, a reset voltage on each pixel line is converted. The reset voltage can be the voltage at the pixel without any image information. In a second phase, the reset voltage plus the image information are converted. By subtracting the two outputs, the reset voltage is cancelled out, while image information is retained. Because some of the noise is common in both phases, the subtraction tends to reduce the noise influences of the pixel ramp voltage generator 110 and the comparators 150 (e.g., much of the low-frequency noise), as long as that noise does not appreciably change between the two conversion phases.

Even with such subtraction, pixel ramp voltage generator 110 and the comparators 150 tend to contribute noise to the pixel outputs (e.g., as artifacts on pixel output voltages 154). For example, it can be seen in FIG. 1 that the same ramp voltage ($V_R$ 145) is shared many pixels, such as across an entire row of pixels. As modern image sensors can typically include thousands of pixels in each row, there can typically be thousands of comparators 150 being used in the row for analog-to-digital conversion based on the same $V_R$ 145. Many typical image sensor applications are designed to operate within very strict noise specifications at least because the human eye can detect noise patterns even well below random pixel noise levels. For example, human eyes will tend to notice image distortion even where half of a pixel row has added voltage noise that is 10× below (i.e., ten times less that) the random noise level of the individual pixels in the row. One such specification, referred to as "row-temporal noise," relates to variations in the average noise of a pixel row. For example, comparator outputs (e.g., pixel output voltages 154) can be averaged across a row in different frames, and variations of this average across multiple frames can represent the row-temporal noise. Many conventional consumer image sensor applications specify a maximum row-temporal noise of around 20× below the comparator 150 and pixel noise levels. Because noise from the pixel ramp voltage generator is repeated on all the comparator outputs, the average noise of any row tends to strongly correlate to noise in $V_R$ 145. As such, achieving row-temporal noise specifications and/or other noise specifications can involve implementing a pixel ramp voltage generator with very low noise in $V_R$ 145.

However, implementing pixel ramp voltage generators with sufficiently low ramp noise can be difficult for a number of reasons. One reason is that, with all the ADCs (specifically the comparators 150) in a row coupled to a same $V_R$ 145, any noise from the ramp generator can be correlated noise across the pixels in a row, which can be noticeable to the human eye even at very low levels. Another reason is that triggering of any comparator 150 in a row (i.e., a change in state of the pixel output voltage 154) can manifest a kickback voltage on the shared $V_R$ 145 for that row. In some cases, the disturbance on $V_R$ 145 caused by such a kickback voltage can cause subsequent mis-conversions of other pixels in the row, especially where there are sharp transitions. Thus, even at very low levels, these and other sources of noise in the pixel ramp voltage generators can result in detectable image blurring and/or other image distortions.

Embodiments described herein include various circuits and processes to mitigate ramp noise on $V_R$ 145. Embodiments include circuit blocks to address different root causes of such noise. As one example, sample-and-hold techniques are provided to isolate ramp generation components from current generation components and their corresponding noise. As another example, current steering techniques are provided to mitigate changes in low-frequency noise components between phases of a multi-phase conversion cycle. As another example, buffer multiplier techniques are provided to isolate kickback noise of the comparators from components generating the ramp voltage to mitigate image smearing. These and other techniques are described herein.

Figure 3:
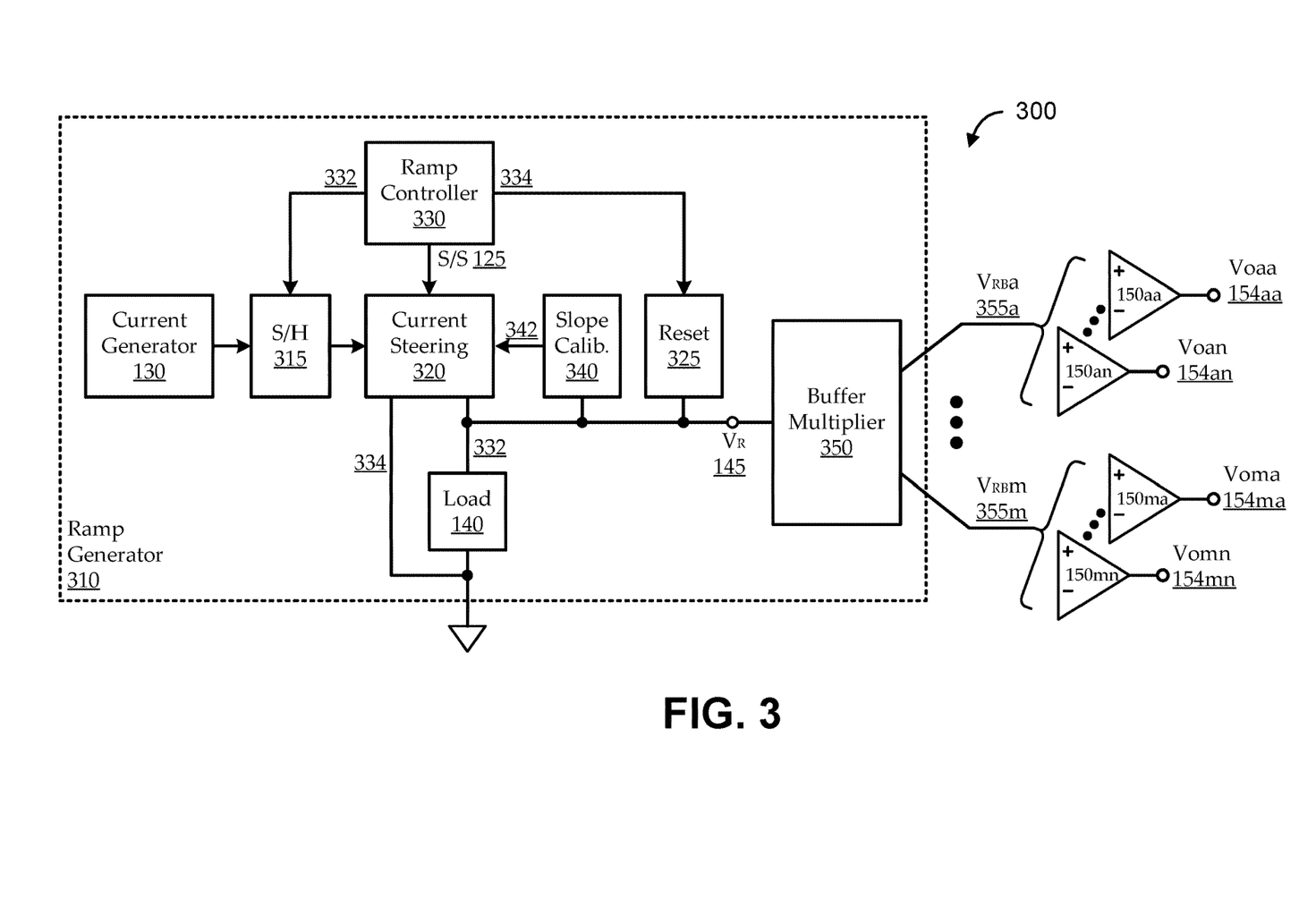
FIG. 3 shows a novel pixel analog-to-digital converter, according to embodiments described herein.

FIG. 3 shows a novel pixel analog-to-digital converter (ADC) 300, according to embodiments described herein. The ADC 300 includes a low-noise pixel ramp voltage generator 310 coupled with multiple comparators 150 (e.g., with an entire row of pixel comparators 150 of an image sensor). Similar to the conventional pixel ramp voltage generator 110 of FIG. 1, the low-noise pixel ramp voltage generator 310 generally uses a current generator 130 to generate a reference current that can be injected into a load 140 to generate a ramp voltage, $V_R$ 145. Each of the multiple comparators 150 is used to convert a respective analog pixel response voltage 152 (not shown to avoid overcomplicating the drawing) to a pixel output voltage 154 based on $V_R$ 145. The low-noise pixel ramp voltage generator 310 further includes a number of components to mitigate various contributing effects on ramp noise.

Embodiments of the low-noise pixel ramp voltage generator 310 include at least a current generator 130, a current steering block 320, a load 140, and a buffer multiplier block 350. The current generator 130 is configured to generate a reference current, such as a substantially constant reference current. Embodiments of the current steering block 320 are coupled with the current generator 130 to selectively toggle between a ramp-run mode and a ramp-off mode based on a ramp start/stop signal 125. When the current steering block 320 is operating in the ramp-run mode, embodiments can steer the reference current to a load path 332 (e.g., to inject the current into load 140) to generate the ramp voltage ($V_R$ 145) at a ramp voltage output node. When the current steering block 320 is operating in the ramp-stop mode, embodiments can steer the reference current to a ramp-stop path 334. In some implementations (e.g., as illustrated), the ramp-stop path 334 is a ground path. In other implementations, the ramp-stop path 334 can include any suitable current path that is an alternative to the load path 332 used to generate the ramp voltage 145.

For example, conventional pixel ramp voltage generators typically run a current source when generating $V_R$ 145, and turn off the current source, or decouple the current source from the load path, to stop generating $V_R$ 145 (i.e., when the ramp is complete). Each time the current source is turned back on, it may have slightly different noise components. As such, turning the current source off and on between phases of a two-phase pixel conversion cycle can result in differences in low-frequency noise between the two phases. If the ADC outputs from the two phases are subtracted, the changing noise will tend to be doubled. In the low-noise pixel ramp voltage generator 310, by steering the current between the two phases (instead of switching it off), the same low-frequency noise can be maintained in both phases of each pixel conversion cycle. As such, when the ADC 300 outputs are subtracted for the two conversion phases, the now-common low-frequency noise from the current source will tend to cancel out.

Embodiments of the buffer multiplier block 350 include a number of buffers. Each buffer is coupled with the ramp voltage output node (i.e., with $V_R$ 145) and is configured to buffer the $V_R$ 145 to output a respective buffered-ramp input voltage ($V_{RB}$) 355. For example, if the buffer multiplier block 350 includes an integer number (M) of buffers, it will produce M $V_{RB}$ 355 outputs. Each of the $V_{RB}$ 355 outputs can be coupled with a respective set of pixel conversion comparators 150. Each respective set of pixel conversion comparators 150 can include any suitable integer number of comparators 150. In some implementations, one or more of the sets of pixel conversion comparators 150 is a single comparator 150. In some implementations, different sets of pixel conversion comparators 150 have different numbers of comparators 150. In some implementations, each set of pixel conversion comparators 150 has a same number (N) of comparators, such that the total number of comparators 150 coupled with the buffer multiplier block 350 is M×N. M and N can be any suitable number, and they may be equal or not equal. As one example, the buffer multiplier block 350 can include 100 buffers (M=100), each coupled with a respective set of 100 comparators 150 (N=100), to support a row of 10,000 pixels. As another example, the buffer multiplier block 350 can include 100 buffers (M=100), each coupled with a respective set of 1,000 comparators 150 (N=1,000), to support a row of 100,000 pixels. As another example, the buffer multiplier block 350 can include 1,000 buffers (M=1,000), each coupled with a respective set of 100 comparators 150 (N=100), to support a row of 100,000 pixels.

The buffer multiplier block 350 can effectively use the buffers to isolate kickback noise of the comparators 150 from the ramp voltage output node. Without the buffers, the comparators 150 tend to kickback charges to the comparator 150 inputs, which tend to couple back to the load 140. The kickback voltage tends to manifest as a disturbance on $V_R$ 145 and can appear as a smear in a converted output image. Implementing the buffer multiplier block 350 with a buffer per every comparator 150 (i.e., M=N) can eliminate smear completely, as there may be no coupling between the inputs of the comparators 150. However, this may be impractical in many contexts, as adding a very large number of buffers can appreciably increase area and power consumption. As such, some embodiments seek to optimize the number of buffers to use in the buffer multiplier block 350. The buffer power can be designed, such that its output noise is below the random noise level of the pixel noise. Consequently, the random noise level of the pixel is not affected. Further, the number of buffers to be used (N) can be chosen, such that the average noise power of all the buffers (e.g., given by $V_{NB}^2/N$) is at least below the random noise level by a predetermined row-temporal noise factor (e.g., 20×). The maximum number of comparators 150 that can be coupled with any single buffer can be limited by the kickback in a worst case scenario, such as when all the coupled comparators 150 except one are kicking back at the same time, while the remaining coupled comparator 150 is the victim. The maximum number of comparators 150 is chosen to ensure that the kickback noise in such a scenario remains negligible relative to the random pixel noise.

Embodiments of the low-noise pixel ramp voltage generator 310 include a sample and hold block 315 coupled between an output of the current generator 130 and an input to the current steering block 320. The sample and hold block 315 can be configured to selectively toggle between a sample mode and a hold mode based on a sample/hold signal 332. When operating in the sample mode, the sample and hold block 315 can sample the reference current being output by the current generator 130. When operating in the hold mode, the sample and hold block 315 can hold the reference current as sampled by the sample and hold block in the sample mode. For example, the sample and hold block 315 can hold by maintaining the reference current itself, and/or by maintaining a voltage or other value that corresponds to the reference current. Similarly, references herein to generating, providing, sampling, holding, receiving, and/or performing any other suitable actions with currents can generally be implemented by configuring components to perform such actions with corresponding voltages; and references herein to generating, providing, sampling, holding, receiving, and/or performing any other suitable actions with voltages can be implemented by performing such actions with corresponding currents. Embodiments of the sample and hold block 315 can also decouple the current steering block 320 from the current generator 130 as needed. For example, when the sample and hold block 315 is in the hold mode, the sample and hold block 315 electrically decouples (e.g., isolates) the current steering block 320 from the current generator 130, such that the current steering block 320 receives the reference current from the sample and hold block 315 (i.e., as held by the sample and hold block 315 while the sample and hold block 315 is in the hold mode). In conventional architectures, components of the current generator 130 can contribute noise to the ramp generation, and the contributed noise may change, even between phases of a multi-phase pixel conversion. Using the sample and hold block 315 to isolate the current steering block 320 from the current generator 130 can suppress (or even eliminate) noise coming from those current generator 130 components. Such isolation can provide additional features, such as improving the power supply rejection ratio, as described below.

Some embodiments of the low-noise pixel ramp voltage generator 310 further include a reset block 325. The reset block 325 can be coupled with the ramp voltage output node to force $V_R$ 145 to zero (or any other suitable reset voltage level, such as a millivolt, a microvolt, etc.) responsive to a reset signal 334. For example, between each pixel conversion cycle (or between each phase of a multi-phase pixel conversion cycle), $V_R$ 145 can be reset to a starting level, such as a ground reference level. In one implementation, the reset block 325 is essentially a switch coupled between the ramp voltage output node and a ground reference, and the reset signal 334 closes the switch, thereby effectively pulling $V_R$ 145 to ground.

Some embodiments of the low-noise pixel ramp voltage generator 310 further include a slope calibration engine 340. The slope calibration engine 340 can operate to dynamically adjust the generation of $V_R$ 145 by the current steering block 320, so that $V_R$ 145 rises in accordance with a predetermined slope characteristic (e.g., substantially at a predefined constant slope). In some embodiments, the slope calibration engine 340 is coupled between the ramp voltage output node and an input of the current steering block 320. The slope calibration engine 340 can generate a current adjustment control signal 342 as a function of $V_R$ 145, and the current adjustment control signal 342 can be fed back to the current steering block 320 to dynamically tune the current steering block 320, so that the rise of $V_R$ 145 meets the predetermined slope characteristic.

Embodiments of the low-noise pixel ramp voltage generator 310 further include a ramp controller 330. The ramp controller 330 can be configured to generate some or all of the control signals used to control other components of the low-noise pixel ramp voltage generator 310. For example, the low-noise pixel ramp voltage generator 310 is configured, for each pixel conversion cycle (or each phase thereof), to follow a sequence of states; and the ramp controller 330 is configured to control states of the control signals to achieve the sequence of states of the low-noise pixel ramp voltage generator 310. For example, the ramp controller 330 generates some or all of the start/stop signal 125, the sample/hold signal 332, and the reset signal 334. For a first stage of a particular phase of a particular pixel conversion cycle, the ramp controller 330 can toggle a state of the sample/hold signal 332 to sample, and then hold a reference current from the current generator 130; and toggle a state of the reset signal 334 to reset $V_R$ 145. In a next stage, the ramp controller 330 can toggle the state of the start/stop signal 125 to switch the current steering block 320 to ramp-run mode, thereby generating the voltage ramp on $V_R$ 145. In a next stage, the ramp controller 330 can toggle the state of the start/stop signal 125 again to switch the current steering block 320 to ramp-stop mode, thereby stopping generating the voltage ramp.

Embodiments of the ramp controller 330 can be implemented in any suitable manner. For example, the ramp controller 330 can include, or can be implemented on, a central processing unit CPU, an application-specific integrated circuit (ASIC), an application-specific instruction-set processor (ASIP), a graphics processing unit (GPU), a physics processing unit (PPU), a digital signal processor (DSP), a field-programmable gate array (FPGA), a programmable logic device (PLD), a controller, a microcontroller unit, a reduced instruction set (RISC) processor, a complex instruction set processor (CISC), a microprocessor, or the like, or any combination thereof. While illustrated as part of the low-noise pixel ramp voltage generator 310, the ramp controller 330 can be implemented as a separate component in communication with the low-noise pixel ramp voltage generator 310. For example, the low-noise pixel ramp voltage generator 310 can be implemented with control input nodes, and those control input nodes can be coupled with signal output nodes of a separate processor implementing the ramp controller 330.

Figure 4:
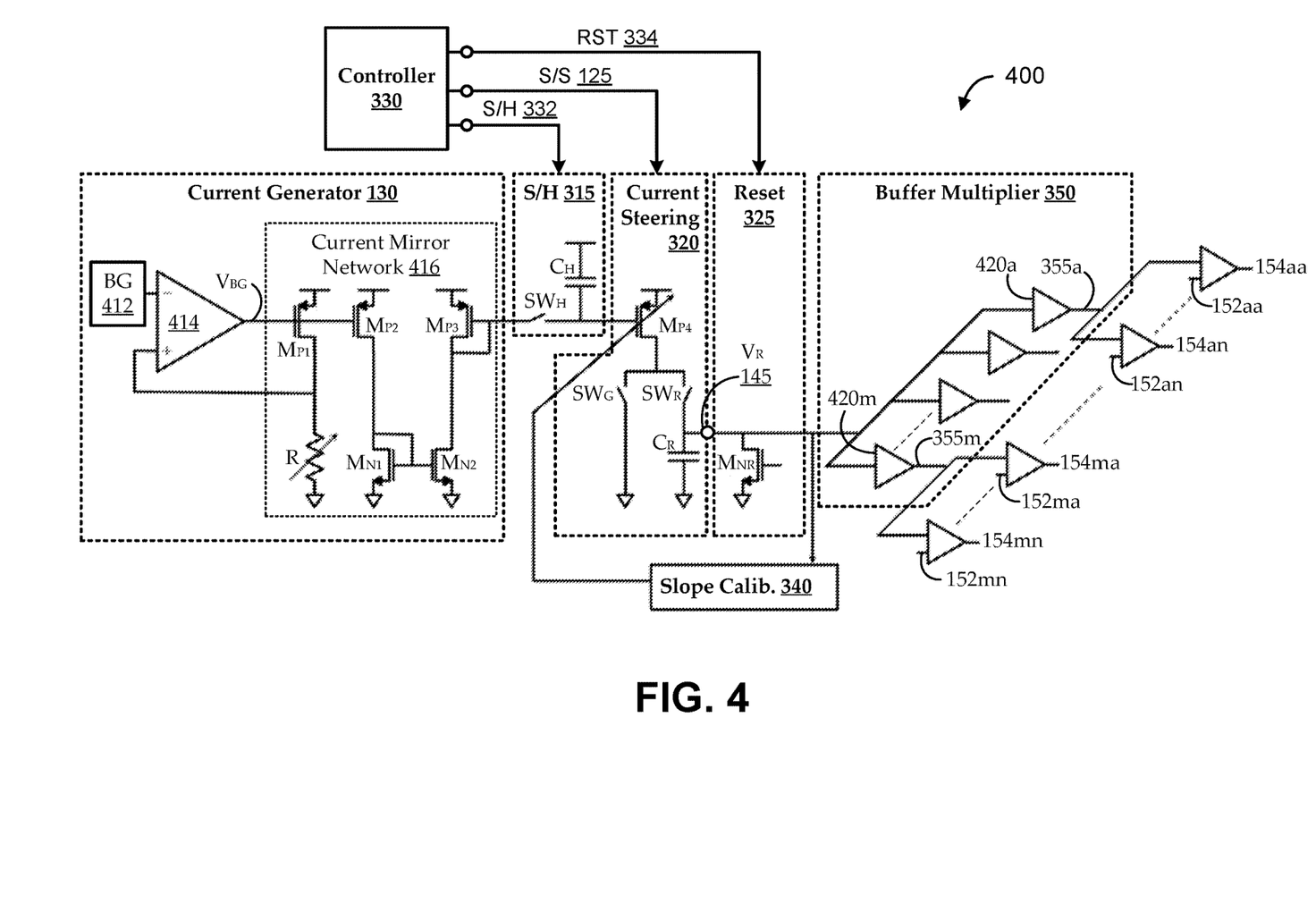
FIG. 4 shows a simplified circuit implementation of a novel pixel analog-to-digital converter, according to embodiments described herein.

FIG. 4 shows a simplified circuit implementation of a novel pixel analog-to-digital converter (ADC) 400, according to embodiments described herein. The ADC 400 includes various components to implement the low-noise pixel ramp voltage generator 310 of FIG. 3, and those components are coupled with multiple comparators 150 (e.g., with an entire row of pixel comparators 150 of an image sensor). As described with reference to FIG. 3, embodiments can include some or all of a current generator 130, a sample and hold block 315, a current steering block 320, a reset block 325, a slope calibration engine 340, a buffer multiplier block 350, and a ramp controller 330.

The illustrated implementation of the current generator 130 generates the reference current based on a bandgap voltage source 412. The bandgap voltage source 412 is used, via an operational amplifier 414, to generate a reference voltage ($V_{BG}$), which is converted to a reference current by dividing a buffered version of $V_{BG}$ by a programmable resistor, R. The reference current (i.e., the current through R) is effectively $V_{BG}/R$. The reference current is then substantially repeated to an output of the current generator 130 via a current mirror network 416. For example, in the current mirror network 416, the reference current is repeated from $M_{P1}$ to $M_{P2}$, and mirrored through an NMOS current mirror from $M_{N1}$ to $M_{N2}$. The mirrored current through $M_{N2}$ also passes through PMOS diode-connected transistor, $M_{P3}$. The gate voltage of $M_{P3}$ corresponds to the current passing through $M_{P3}$, which is the reference current. As such, the reference current output of the current generator 130 can be considered as the reference current itself, or as the gate voltage of $M_{P3}$, which corresponds directly to the reference current (i.e., applying the same gate voltage to another substantially equivalent transistor can cause the substantially equivalent transistor to generate a current substantially equivalent to the reference current).

A sample and hold block 315 is coupled between the current generator 130 and the current steering block 320. As illustrated, the sample and hold block 315 can include a hold capacitor (CH) and a hold switch (SWH). One side of the hold switch is coupled with the gate of $M_{P3}$, and the other side of the hold switch is coupled with both the hold capacitor and with a gate of a substantially equivalent transistor ($M_{P4}$) in the current steering block 320. The state of the hold switch can be responsive to the sample/hold signal 332, such that the switch is closed in sample mode, and the switch is open in hold mode. When SWH is closed (i.e., in sample mode), the gates of $M_{P3}$ and $M_{P4}$ are tied together, such that the reference current through $M_{P3}$ is effectively mirrored to $M_{P4}$. In contrast, when SWH is opened (i.e., in hold mode), the gate of $M_{P4}$ is isolated from the gate of $M_{P3}$ and from all the other components of the current generator 130. Additionally, when SWH is closed (i.e., in sample mode), the hold capacitor charges to a voltage level corresponding to the gate voltage of $M_{P3}$ (i.e., a negative voltage level, as both $M_{P3}$ and $M_{P4}$ are PMOS transistors). As such, when SWH is opened (i.e., in hold mode), the gate voltage of $M_{P4}$ is effectively set by the voltage across the hold capacitor, which should substantially match the gate voltage of $M_{P3}$ sampled in sample mode. As such, the current through $M_{P4}$ can remain substantially at the reference current level in both the sample and hold modes of operation of the sample and hold block 315, except that $M_{P4}$ is isolated from the current generator 130 when the sample and hold block 315 is in hold mode.

As described above, embodiments of the current steering block 320 can selectively operate in one of a ramp-run mode or a ramp-off mode based on a ramp start/stop signal 125. As illustrated, the current steering block 320 can include two switches: $SW_R$ and $SW_G$. The start/stop signal 125 can toggle the current steering block 320 into the ramp-run mode by closing $SW_R$ and opening $SW_G$. This can effectively steer the current flowing through $M_{P4}$ into a load path including a ramp capacitor (CR) through $SW_R$. The ramp capacitor is an implementation of load 140. In the ramp-run mode, the steering causes the current to be injected into the ramp capacitor, which causes the ramp capacitor to charge, and the voltage across the ramp capacitor to rise (e.g., linearly). The voltage across the ramp capacitor can be used as $V_R$ 145. The start/stop signal 125 can toggle the current steering block 320 into the ramp-stop mode by opening $SW_R$ and closing $SW_G$. This can effectively steer the current flowing through $M_{P4}$ into a ramp-stop path (e.g., ground path) through $SW_G$. As noted above, this can effectively stop the generation of the ramp voltage without turning off or disconnecting $M_{P4}$. For example, the current steering block 320 is toggled to ramp-run mode during each conversion phase, and is toggled to ramp-stop mode between the phases.

Some embodiments of the low-noise pixel ramp voltage generator 310 further include a reset block 325. The illustrated implementation of the reset block 325 is a transistor ($M_{NR}$) coupled between the ramp voltage output node (i.e., the output of the current steering block 320) and a ground reference. The gate of $M_{NR}$ can be coupled with the reset signal 334, such that asserting (e.g., or de-asserting) the reset signal 334 turns ON $M_{NR}$, thereby pulling the ramp voltage output node to the ground reference. This can effectively reset $V_R$ 145 to ground.

The ramp voltage output node can also be coupled with the buffer multiplier block 350. As illustrated, the buffer multiplier block 350 includes a number of buffers 420. Each buffer 420 receives the same $V_R$ 145 and outputs a respective buffered version of $V_R$ 145, illustrated as $V_{RB}$ 355. For example, M buffers (buffer 420a-buffer 420m) output M buffered ramp voltages ($V_{RB}$a 355a-$V_{RB}$m 355m). The output of each buffer 420 can be coupled with a respective set of N comparators 150. For example, the set of N pixel conversion comparators 150 coupled with buffer 420a are labeled as comparator 150aa-comparator 150an, and the set of N pixel conversion comparators 150 coupled with buffer 420m are labeled as comparator 150ma-comparator 150mn. This represents that, with a respective set of N pixel conversion comparators 150 coupled with each of M buffers 420, there are M×N total comparators 150. Each of the comparators 150 generates a respective pixel output voltage

154 based on a comparison of its respective $V_{RB}$ 355 with its respective pixel response voltage 152. As noted above, the buffer multiplier block 350 can mitigate smearing by effectively isolating effects of kickback from any comparator 150 only to other comparators 150 in the same set (coupled with a same buffer 420).

Figure 5:
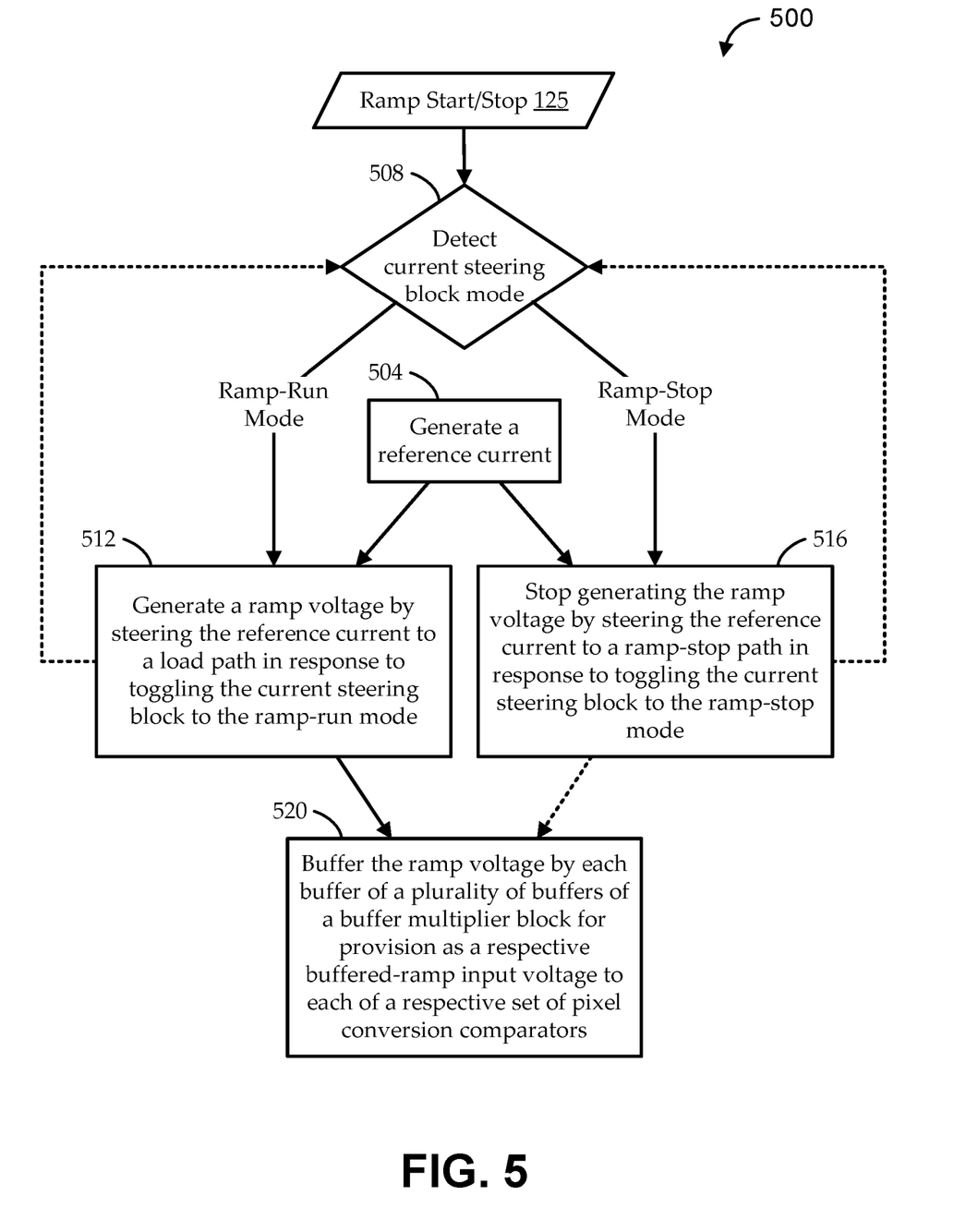
FIG. 5 shows a flow diagram of an illustrative method for generating a pixel ramp voltage, according to various embodiments.

FIG. 5 shows a flow diagram of an illustrative method 500 for generating a pixel ramp voltage, according to various embodiments. Embodiments of the method 500 can be performed using the low-noise pixel ramp voltage generator 310, and related components, for example as described with reference to FIGS. 3 and 4. Embodiments begin at stage 504 by generating a reference current by a current generator. At stage 508, embodiments can detect whether a current steering block is toggled to operate in a ramp-run mode, or in a ramp-stop mode based on a ramp start/stop signal 125.

For example, at a first time, the detection at stage 508 indicates to operate the current steering block in the ramp-run mode. In response to the detection at the first time, at stage 512, embodiments can generate a ramp voltage by steering the reference current (generated at stage 504) to a load path. In some embodiments, generating the current at stage 512 includes dynamically tuning the current steering block to generate the ramp voltage to have a predetermined slope characteristic by generating a current adjustment control signal as a function of the ramp voltage, and feeding back the current adjustment control signal to tune the current steering block. At a second time (e.g., subsequent to the first time), the detection at stage 508 indicates to operate the current steering block in the ramp-stop mode. In response to the detection at the second time, at stage 516, embodiments can stop generating the ramp voltage by steering the reference current to a ramp-stop path.

At stage 520, embodiments can buffer the ramp voltage by each of multiple buffers of a buffer multiplier block for provision as a respective buffered-ramp input voltage to each of a respective set of pixel conversion comparators. In some implementations, the buffering at stage 520 occurs while the ramp voltage is being generated in stage 512. In some implementations, the buffering at stage 520 occurs additionally while the ramp voltage has stopped being generated in stage 516. In some implementations, the method 500 iterates to perform another determination at stage 508.

In some embodiments, generating the reference current at stage 504 can further include sample and hold features. For example, responsive to a first state of a sample/hold signal indicating to toggle a sample and hold block to operate in a sample mode, embodiments can sample the reference current from the current generator as generated at stage 504. Responsive to second state of the sample/hold signal indicating to toggle the sample and hold block to operate in a hold mode, embodiments can hold the reference current as sampled by the sample and hold block in the sample mode, and/or can decouple the current steering block from the current generator, such that the current used in stages 512 and/or 516 is the reference current as held by the sample and hold block in the hold mode (e.g., as generated from a voltage help by the sample and hold block, where the voltage corresponds to the reference current).

Figure 6:
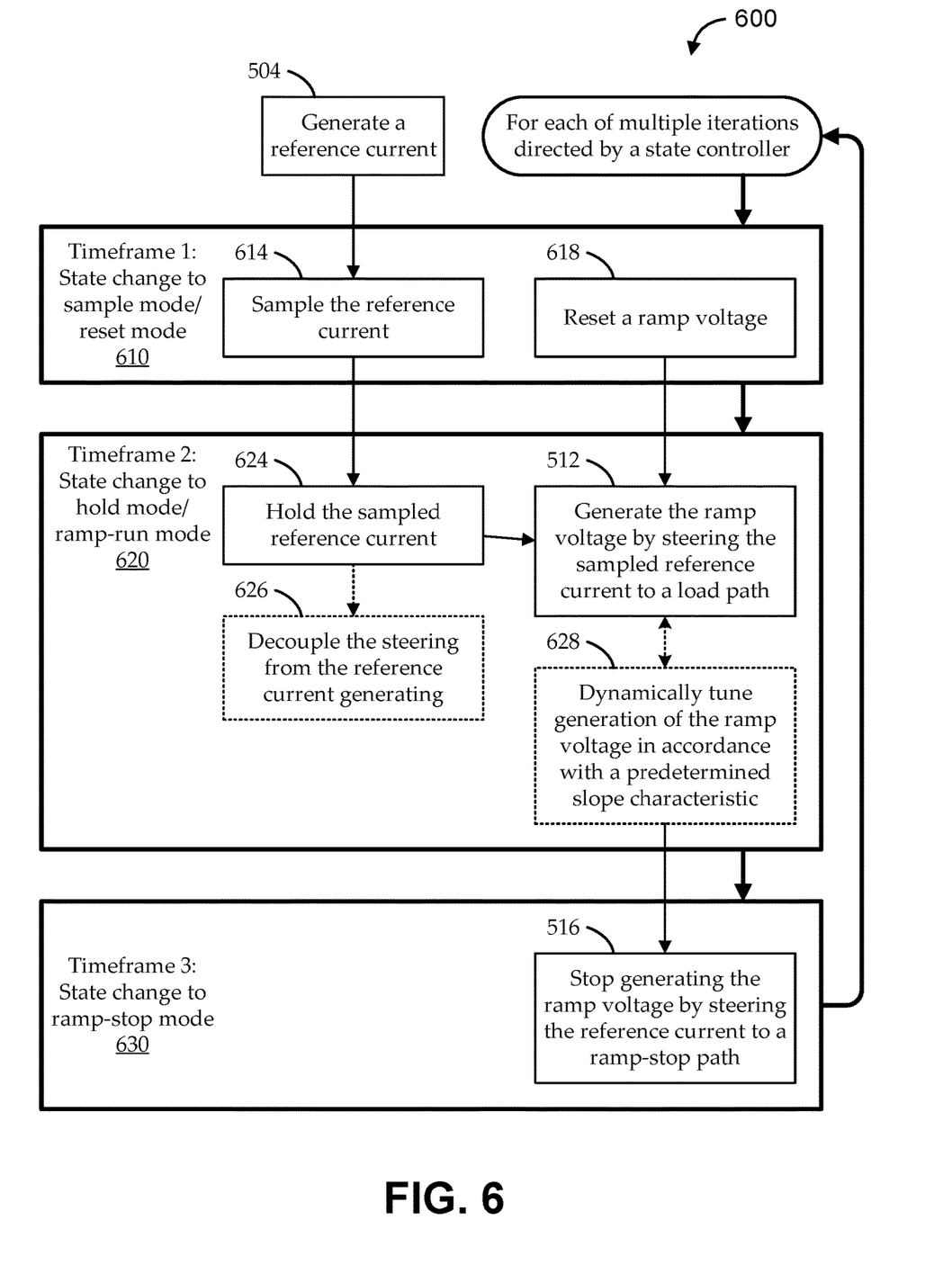
FIG. 6 shows a flow diagram of another illustrative method for generating a pixel ramp voltage, according to various embodiments.

FIG. 6 shows a flow diagram of another illustrative method 600 for generating a pixel ramp voltage, according to various embodiments. Embodiments of the method 600 can be performed using the low-noise pixel ramp voltage generator 310, and related components, for example as described with reference to FIGS. 3 and 4. As in the method 500 of FIG. 5, embodiments can begin at stage 504 by generating a reference current by a current generator. The remaining stages of the method 600 are illustrated as iterative. For example, a controller is used to sequentially change the state of various components to support performing a pixel conversion, or a phase of a pixel conversion. As illustrated, the sequence can include a first timeframe 610, a second timeframe 620, and a third timeframe 630, after which the method 600 can return to the first timeframe 610.

In the first timeframe 610, the state can be set by the controller, so that a sample and hold block is in sample mode, and a reset block is in reset mode. As such, at stage 614, embodiments can sample the reference current from the current generator to generate a sampled reference current. In some implementations, the sampling at stage 614 does not happen in every ramp cycle. At stage 618, embodiments can reset a ramp voltage.

In the second timeframe 620, the state can be set by the controller, so that the sample and hold block is in hold mode, and a current steering block is in ramp-run mode. As such, at stage 624, embodiments can hold the sampled reference current. Further embodiments can generate the ramp voltage by steering the sampled reference current (as held by the sample and hold block) to a load path, for example, as described with reference to stage 512 of FIG. 5. As described herein, at least during this second timeframe 620, the ramp voltage can be buffered by each of multiple buffers of a buffer multiplier block and provided, as a respective buffered-ramp input voltage, to each of a respective set of pixel conversion comparators. In some embodiments, toggling the sample and hold block to hold mode further decouples (e.g., isolates) the current steering functions from the current generation functions at stage 626. In addition to generating the ramp voltage at stage 512 (e.g., or as part of the generating at stage 512), at stage 628, some embodiments can generate a current adjustment control signal as a function of the ramp voltage and can feed back the current adjustment control signal to dynamically tune generation of the ramp voltage in accordance with a predetermined slope characteristic. In some such embodiments, the dynamic tuning at stage 628 does not happen in every ramp cycle.

In the third timeframe 630, the state can be set by the controller, so that the sample and hold block remains in hold mode, and the current steering block is in ramp-stop mode. As such, embodiments can stop generating the ramp voltage by steering the sampled reference current (as held by the sample and hold block) to a ramp-stop path, for example, as described with reference to stage 516 of FIG. 5.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A pixel ramp voltage generator, comprising:
   a current generator to generate a reference current;
   a current steering block coupled with the current generator to selectively toggle between a ramp-run mode and a ramp-stop mode based on a ramp start/stop signal,
   the current steering block being configured, when operating in the ramp-run mode, to steer the reference current to a load path to generate a ramp voltage at a ramp voltage output node, and
   the current steering block being configured, when operating in the ramp-stop mode, to steer the reference current to a ramp-stop path; and
   a buffer multiplier block comprising a plurality of buffers, each buffer coupled with the ramp voltage output node and configured to buffer the ramp voltage for provision as a respective buffered-ramp input voltage to each of a respective set of pixel conversion comparators.

2. The pixel ramp voltage generator of claim 1, wherein the current generator comprises a bandgap voltage generator coupled with a current mirror.

3. The pixel ramp voltage generator of claim 1, further comprising:
   a sample and hold block coupled between an output of the current generator and an input to the current steering block and configured to selectively toggle between a sample mode and a hold mode based on a sample/hold signal,
   the sample and hold block configured, when operating in the sample mode, to sample the reference current at the output of the current generator, and
   the sample and hold block configured, when operating in the hold mode, to hold the reference current as sampled by the sample and hold block in the sample mode, and to decouple the current steering block from the current generator, such that the current steering block receives the reference current as held by the sample and hold block in the hold mode.

4. The pixel ramp voltage generator of claim 1, wherein the buffer multiplier block comprises M buffers, each configured to provide the respective buffered-ramp input voltage to a respective set of N pixel conversion comparators, such that the ramp voltage output node is coupled, via the buffer multiplier block, with M×N pixel conversion comparators, wherein M and N are positive integers.

5. The pixel ramp voltage generator of claim 4, wherein M does not equal N.

6. The pixel ramp voltage generator of claim 1, wherein the plurality of buffers is M buffers, M being a positive integer determined, so that an average noise power across the M buffers is less than a random noise level by at least a predetermined row-temporal-noise factor for the pixel ramp voltage generator.

7. The pixel ramp voltage generator of claim 6, wherein the predetermined row-temporal-noise factor is at least 20.

8. The pixel ramp voltage generator of claim 1, further comprising:
   a controller coupled with the current steering block to generate at least the ramp start/stop signal.

9. The pixel ramp voltage generator of claim 1, further comprising:
   a slope calibration engine coupled between the ramp voltage output node and an input of the current steering block to generate a current adjustment control signal as a function of the ramp voltage, the current adjustment control signal dynamically tuning the current steering block to generate the ramp voltage to have a predetermined slope characteristic.

10. The pixel ramp voltage generator of claim 1, further comprising:
    a reset block coupled with the ramp voltage output node to force the ramp voltage to a predetermined reset level responsive to a reset signal.

11. An analog-to-digital converter for an image sensor comprising:
    the pixel ramp voltage generator of claim 1;
    a controller coupled with the pixel ramp voltage generator to generate a set of control signals including at least the ramp start/stop signal; and
    the respective sets of pixel conversion comparators coupled with the plurality of buffers of the buffer multiplier block.

12. A method for generating a pixel ramp voltage, the method comprising:
    generating a reference current by a current generator;
    first detecting, at a first time, that a ramp start/stop signal changes state to indicate to toggle a current steering block to a ramp-run mode;
    generating a ramp voltage by steering the reference current to a load path in response to toggling the current steering block to the ramp-run mode;

second detecting, at a second time subsequent to the first time, that a ramp start/stop signal changes state to indicate to toggle a current steering block to a ramp-stop mode;

stopping generating the ramp voltage by steering the reference current to a ramp-stop path in response to toggling the current steering block to the ramp-stop mode; and buffering the ramp voltage by each buffer of a plurality of buffers of a buffer multiplier block for provision as a respective buffered-ramp input voltage to each of a respective set of pixel conversion comparators.

13. The method of claim 12, further comprising:
responsive to a first state of a sample/hold signal indicating to toggle a sample and hold block to operate in a sample mode, sampling the reference current from the current generator; and
responsive to second state of the sample/hold signal indicating to toggle the sample and hold block to operate in a hold mode:
holding the reference current as sampled by the sample and hold block in the sample mode; and
decoupling the current steering block from the current generator, such that the current steering block receives the reference current as held by the sample and hold block in the hold mode.

14. The method of claim 12, wherein the buffering is performed by M buffers, each configured to provide the respective buffered-ramp input voltage to a respective set of N pixel conversion comparators, such that a ramp voltage output node is coupled, via the buffer multiplier block, with M×N pixel conversion comparators, wherein M and N are positive integers.

15. The method of claim 14, wherein the buffering is performed by a quantity of buffers determined, so that an average noise power across the M buffers is less than a random noise level by at least a predetermined row-temporal-noise factor.

16. The method of claim 12, further comprising:
dynamically tuning the current steering block to generate the ramp voltage to have a predetermined slope characteristic by generating a current adjustment control signal as a function of the ramp voltage, and feeding back the current adjustment control signal to tune the current steering block.

17. The method of claim 12, further comprising:
resetting the ramp voltage prior to the first detecting.

18. A method for generating a pixel ramp voltage, the method comprising:
generating a reference current;
for each of a plurality of iterations directed by a state controller:
in a first timeframe, sampling the reference current to generate a sampled reference current, and resetting a ramp voltage;
in a second timeframe, subsequent to the first timeframe and triggered by a first change in state of a ramp start/stop signal, holding the sampled reference current, and generating the ramp voltage by steering the sampled reference current to a load path; and
in a third timeframe, subsequent to the second timeframe and triggered by a second change in state of the ramp start/stop signal, stopping generating the ramp voltage by steering the reference current to a ramp-stop path,
wherein the ramp voltage is buffered by each buffer of a plurality of buffers of a buffer multiplier block and provided, as a respective buffered-ramp input voltage, to each of a respective set of pixel conversion comparators.

19. The method of claim 18, further comprising, wherein:
the steering the sampled reference current to the load path and the steering the sampled reference current to the ramp-stop path are performed by a current steering block;
the generating the reference current is performed by a current generator;
the current steering block is coupled with the current generator during the first timeframe; and
the holding the sampled reference current comprises electrically decoupling the current steering block from the current generator during the second timeframe.

20. The method of claim 18, further comprising, in the second timeframe:
generating a current adjustment control signal as a function of the ramp voltage; and
feeding back the current adjustment control signal to dynamically tune generation of the ramp voltage in accordance with a predetermined slope characteristic.

* * * * *